United States Patent
Jacob

(10) Patent No.: US 10,090,385 B1
(45) Date of Patent: Oct. 2, 2018

(54) METHODS OF FORMING A VERTICAL TRANSISTOR DEVICE WITH A CHANNEL STRUCTURE COMPRISED OF ALTERNATIVE SEMICONDUCTOR MATERIALS

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/475,946

(22) Filed: Mar. 31, 2017

(51) Int. Cl.
| | |
|---|---|
| H01L 29/10 | (2006.01) |
| H01L 29/66 | (2006.01) |
| H01L 21/3065 | (2006.01) |
| H01L 21/308 | (2006.01) |
| H01L 21/324 | (2006.01) |
| H01L 21/225 | (2006.01) |

(52) U.S. Cl.
CPC ...... *H01L 29/1054* (2013.01); *H01L 21/2252* (2013.01); *H01L 21/308* (2013.01); *H01L 21/3065* (2013.01); *H01L 21/324* (2013.01); *H01L 29/66666* (2013.01)

(58) Field of Classification Search
CPC ............. H01L 29/1054; H01L 21/2252; H01L 21/3065; H01L 21/308; H01L 21/324; H01L 29/66666
See application file for complete search history.

(56) References Cited

U.S. PATENT DOCUMENTS

| | | | |
|---|---|---|---|
| 9,263,580 B2 | 2/2016 | Jacob et al. | |
| 9,614,077 B1 * | 4/2017 | Cheng | .................. H01L 29/7827 |
| 2009/0065870 A1 | 3/2009 | Li et al. | |
| 2011/0272739 A1 | 11/2011 | Lee et al. | |
| 2012/0091528 A1 | 4/2012 | Chang et al. | |
| 2013/0122676 A1 | 5/2013 | Jeng | |
| 2014/0001543 A1 | 1/2014 | Kim et al. | |
| 2014/0054713 A1 | 2/2014 | Lee et al. | |
| 2015/0001468 A1 | 1/2015 | Huang et al. | |
| 2015/0091094 A1 | 4/2015 | Wan et al. | |
| 2015/0102411 A1 | 4/2015 | Ching et al. | |

* cited by examiner

*Primary Examiner* — Yasser A Abdelaziez
(74) *Attorney, Agent, or Firm* — Amerson Law Firm, PLLC

(57) ABSTRACT

One illustrative method disclosed herein includes, among other things, forming a sacrificial mandrel structure above a semiconductor substrate comprising a first semiconductor material and forming a plurality of vertically-oriented channel semiconductor (VOCS) structures on at least opposing lateral sidewall surfaces of the sacrificial mandrel structure, the VOCS structures comprising a second semiconductor material that is different than the first semiconductor material. In this example, the method also includes selectively removing the sacrificial mandrel structure relative to the VOCS structures and forming upper and lower source/drain regions in each of the VOCS structures and a gate structure around each of the VOCS structures.

16 Claims, 18 Drawing Sheets

METHODS OF FORMING A VERTICAL TRANSISTOR DEVICE WITH A CHANNEL STRUCTURE COMPRISED OF ALTERNATIVE SEMICONDUCTOR MATERIALS

BACKGROUND OF THE INVENTION

1. Field of the Invention

Generally, the present disclosure relates to the manufacture of semiconductor devices, and, more specifically, to various novel methods of forming a vertical transistor device with a channel structure comprised of alternative semiconductor materials.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12 and has an overall vertical height 19. As indicated in the right-hand portion of FIG. 1, the channel semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the channel semiconductor structure 12A, a bottom source/drain (S/D) region 16, a top S/D region 18, a bottom spacer 15B, and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. Device designers are currently investigating alternative semiconductor materials, such as SiGe, Ge and III-V materials, to manufacture devices, which are intended to enhance the performance capabilities of such devices, e.g., to enable low-voltage operation without degrading their operating speed. However, the formation of such alternative channel semiconductor materials in vertical transistor materials can be problematic for several reasons. For example, when the alternative channel semiconductor material is epitaxially grown from the front surface 12S of the substrate 12, there is a limit to the amount of such material that may be formed without the formation of performance-degrading defects in the alternative channel semiconductor material, i.e., if the overall height 19 (in the vertical direction) of the vertically oriented channel semiconductor structure 12A exceeds the critical thickness of the particular alternative channel semiconductor material being formed, then unacceptable defects will be present in the alternative channel semiconductor material. This problem has the practical effect of limiting the overall vertical height 19 of the vertically oriented channel semiconductor structure 12A.

The present disclosure is directed to methods of forming a vertical transistor device with a channel structure comprised of alternative semiconductor materials that may solve or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a vertical transistor device with a channel structure comprised of alternative semiconductor materials. One illustrative method disclosed herein includes, among other things, forming a sacrificial mandrel structure above a semiconductor substrate comprising a first semiconductor material and forming a plurality of vertically-oriented channel semiconductor structures on at least opposing lateral sidewall surfaces of the sacrificial mandrel structure, the vertically-oriented channel semiconductor structures comprising a second semiconductor material that is different than the first semiconductor material. In this example, the method also includes selectively removing the sacrificial mandrel structure relative to the vertically-oriented channel semiconductor structures and forming upper and lower source/drain regions in each of the vertically-oriented channel semiconductor structures and a gate structure around each of the vertically-oriented channel semiconductor structures.

Another illustrative method disclosed herein includes, among other things, forming a sacrificial mandrel structure above a semiconductor substrate comprising a first semiconductor material, performing an epitaxial growth process to form a conformal layer of a second semiconductor material that is different from the first semiconductor material on at least opposing lateral sidewall surfaces and a top surface of the sacrificial mandrel structure and, after performing the epitaxial growth process, performing an anisotropic etching process on the conformal layer of the second semiconductor material to remove horizontally oriented portions of the layer of the second semiconductor material from above at least the top surface of the sacrificial mandrel structure so as to thereby define a plurality of vertically-oriented channel semiconductor structures comprised of the second semiconductor material. In this example, the method further includes selectively removing the sacrificial mandrel structure relative to the vertically-oriented channel semiconductor structures and forming upper and lower source/drain regions in each of the vertically-oriented channel semiconductor structures and a gate structure around each of the vertically-oriented channel semiconductor structures.

Another illustrative method disclosed herein includes, among other things, forming a sacrificial mandrel structure above a semiconductor substrate comprising a first semiconductor material, forming a recessed layer of insulating material in at least one trench defined in the substrate adjacent the sacrificial mandrel structure and performing an epitaxial growth process to form a layer of a second semiconductor material that is different from the first semiconductor material on at least opposing lateral sidewall surfaces but not on a top surface of the sacrificial mandrel structure that is covered by a masking layer so as to thereby define a plurality of vertically-oriented channel semiconductor structures positioned on at least the opposing lateral sidewall surfaces. In this example, the method further includes removing the masking layer so as to expose the top surface of the sacrificial mandrel structure, selectively removing the sacrificial mandrel structure relative to the vertically-oriented channel semiconductor structures by performing a mandrel-removal etching process, thereby leaving the vertically-oriented channel semiconductor structures in position above a first portion of the recessed layer of insulating material, and forming upper and lower source/drain regions in each of the vertically-oriented channel semiconductor structures and a gate structure around each of the vertically-oriented channel semiconductor structures.

Another illustrative method disclosed herein includes, among other things, forming a sacrificial mandrel structure above a semiconductor substrate comprising a first semiconductor material, forming a recessed layer of insulating material in at least one trench defined in the substrate adjacent the sacrificial mandrel structure and performing a first epitaxial growth process to form a first layer of a second semiconductor material that is different from the first semiconductor material on at least opposing lateral sidewall surfaces and a top surface of the sacrificial mandrel structure and above a first portion of the recessed layer of insulating material. In this example, the method also includes performing a second epitaxial growth process to form a second layer of a third semiconductor material that is different from the second semiconductor material on the first layer and above a second portion of the recessed layer of insulating material, performing a first anisotropic etching process on the second layer to remove at least horizontally oriented portions of the second layer from above the first layer so as to thereby define a plurality of first vertically-oriented channel semiconductor structures comprised of the third semiconductor material positioned adjacent the first layer and above the second portion of the recessed layer of insulating material, after performing the first anisotropic etching process, performing a second anisotropic etching process on the first layer to remove at least horizontally oriented portions of the first layer from above the top surface of the sacrificial mandrel structure so as to thereby define a plurality of second vertically-oriented channel semiconductor structures comprised of the second semiconductor material positioned adjacent at least the opposing sidewalls of the sacrificial mandrel structure above the first portion of the recessed layer of insulating material, and selectively removing the sacrificial mandrel structure relative to the first and second vertically-oriented channel semiconductor structures by performing a mandrel-removal etching process.

BRIEF DESCRIPTION OF THE DRAWINGS

The disclosure may be understood by reference to the following description taken in conjunction with the accompanying drawings, in which like reference numerals identify like elements, and in which.

Figure 1:
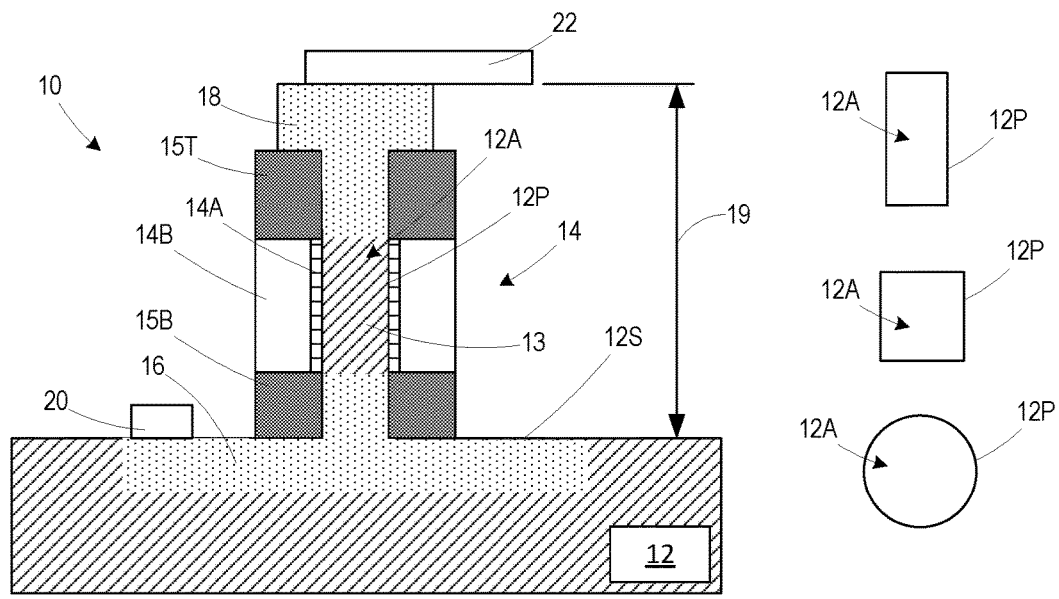
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2J depict various illustrative novel methods disclosed herein for forming a vertical transistor device 100 with a vertically-oriented channel semiconductor structure 110 comprised of an alternative semiconductor material, which, as used herein, should be understood to mean a semiconductor material other than the semiconductor material of the substrate 102. In the case where the substrate is made of a traditional silicon material, the alternative semiconductor material may be a material such as silicon-germanium ($Si_{(1-x)}Ge_{(x)}$), substantially pure germanium (Ge), a III-V compound semiconductor material, etc. Of course, an integrated circuit (IC) product may typically include millions of such vertical transistor devices 100. In the illustrated examples, the vertical transistor devices have a generally rectangular cross-section when viewed from above. In other embodiments, the vertical transistor devices 100 may have different cross-section shapes when viewed from above, such as circle, oval, square, etc. (as depicted in the prior art structure 10 of FIG. 1).

Figure 2A:
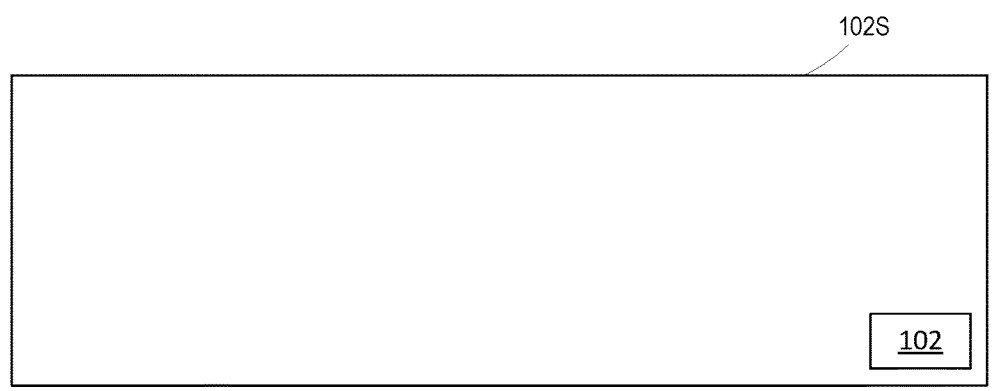
FIGS. 2A-2N depict various illustrative novel methods disclosed herein for forming a vertical transistor device with a channel structure comprised of alternative semiconductor materials.
Figure 2B:
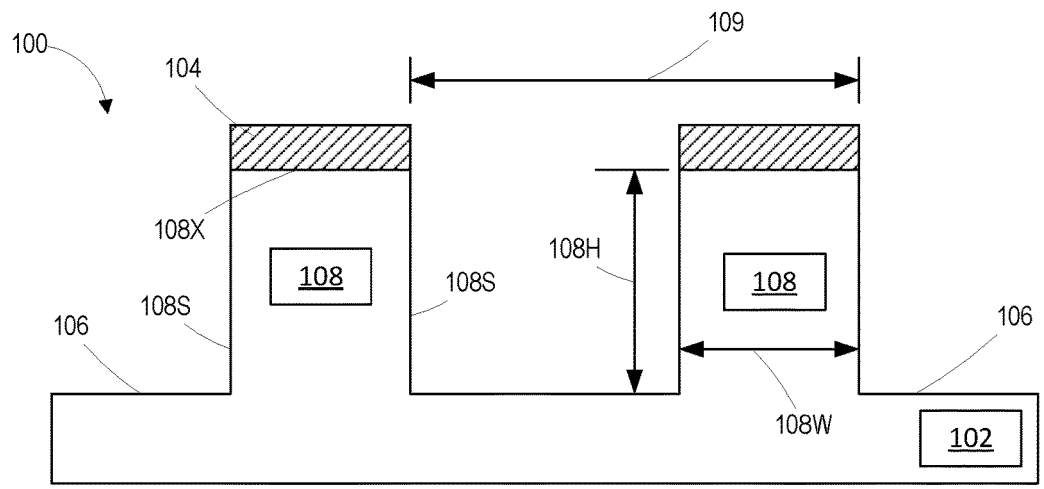
Figure 2C:
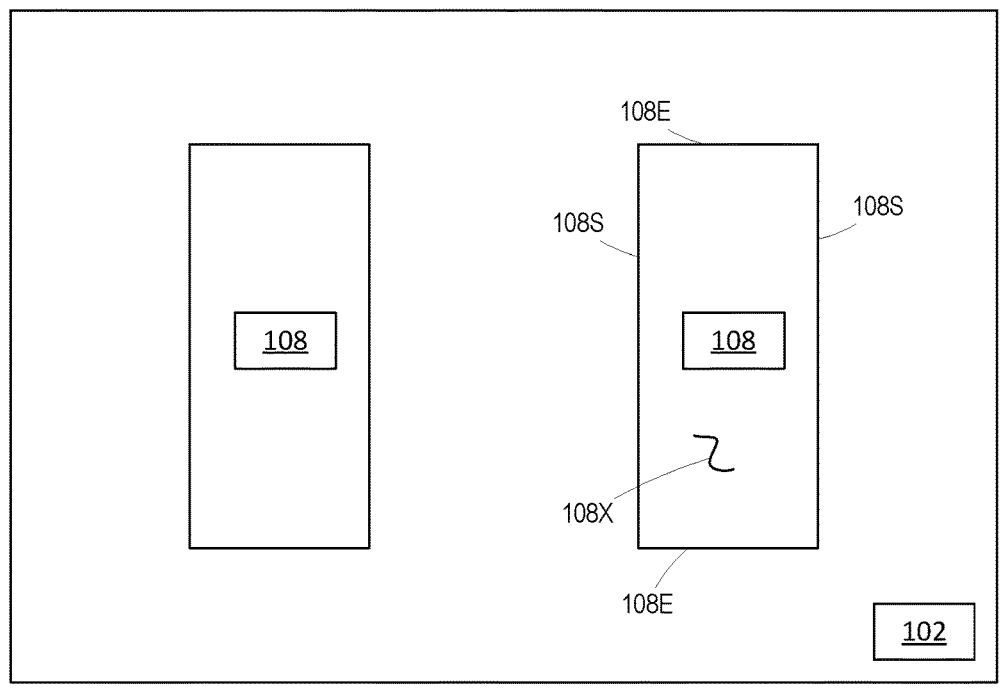
Figure 2D:
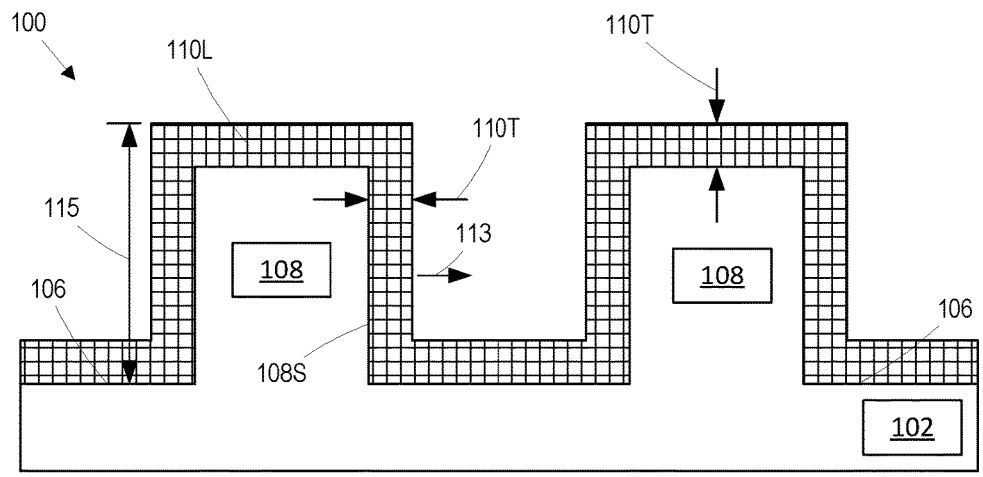
Figure 2E:
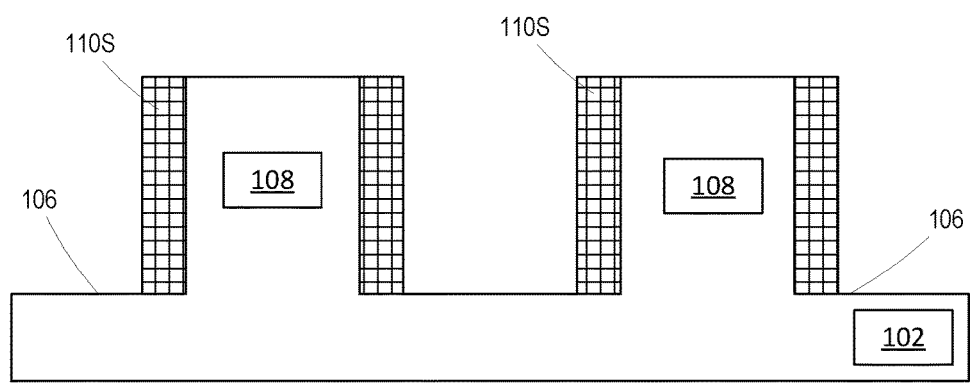
Figure 2F:
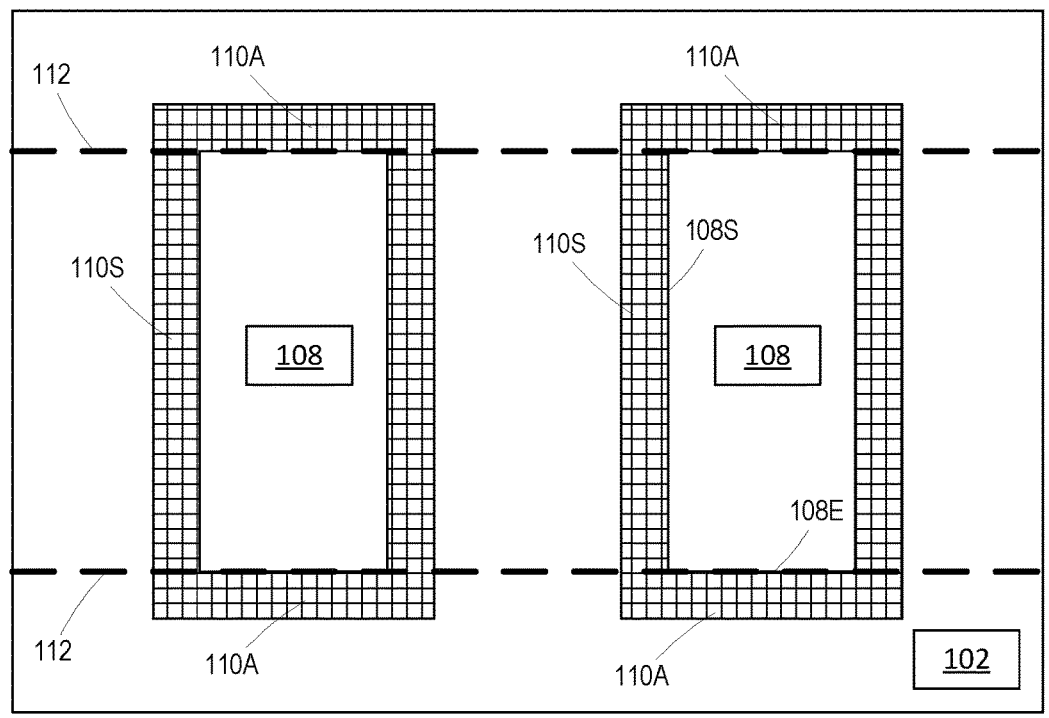
Figure 2G:
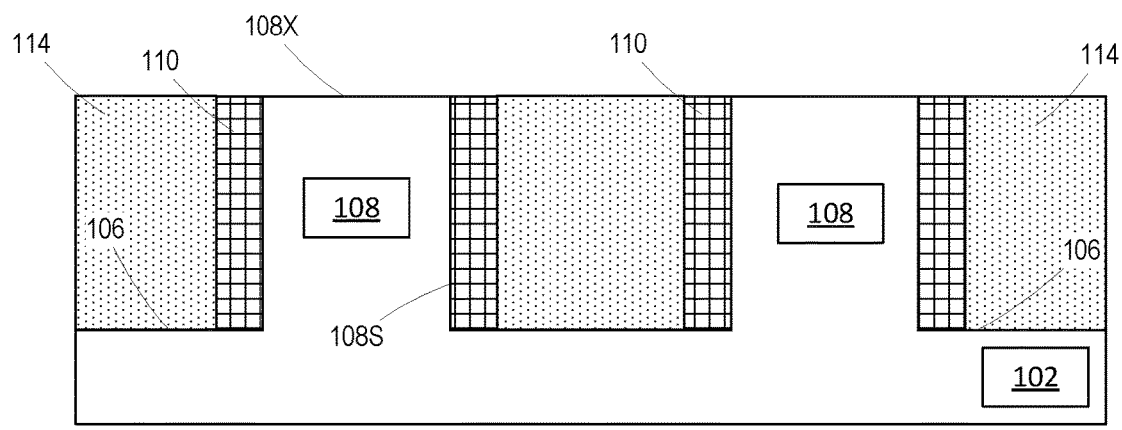
Figure 2H:
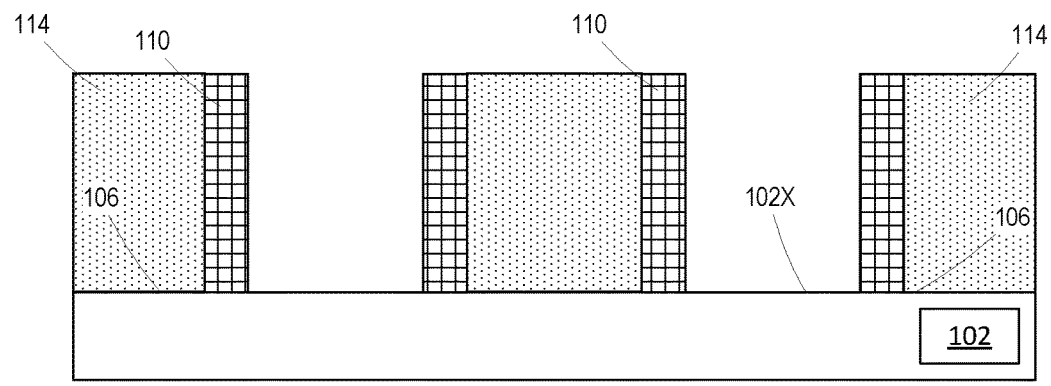
Figure 2I:
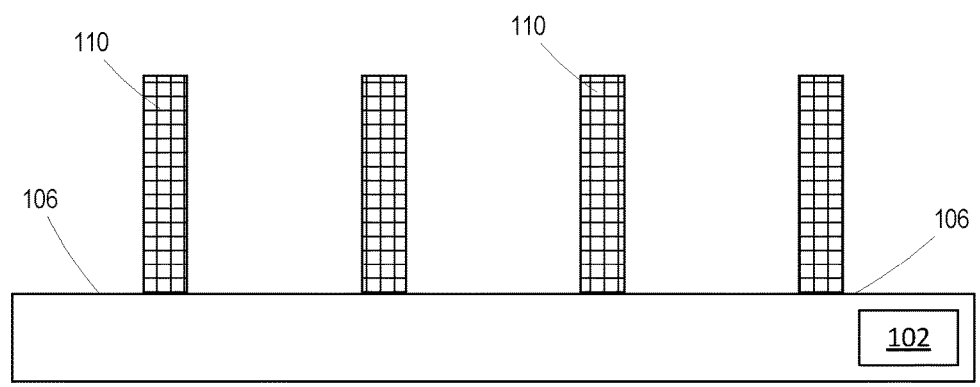
Figure 2J:
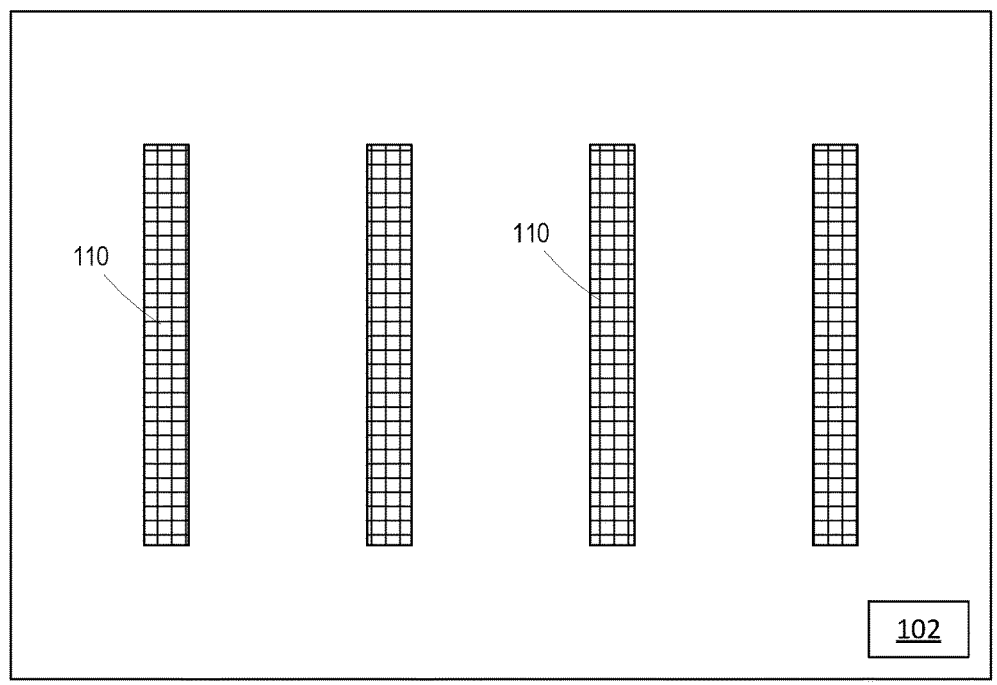
Figure 2K:
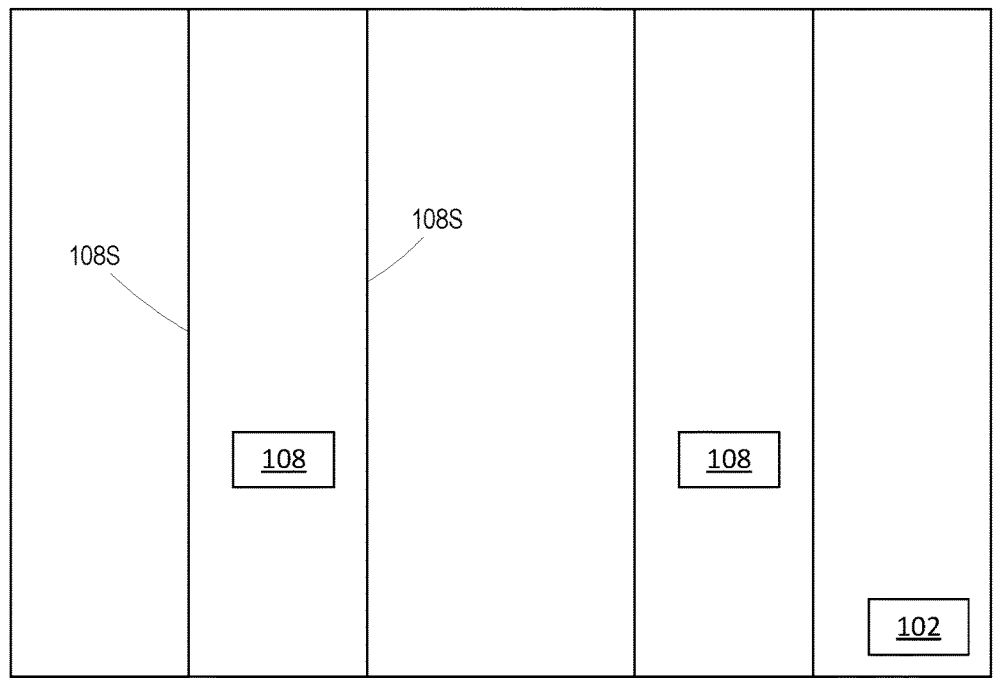
Figure 2L:
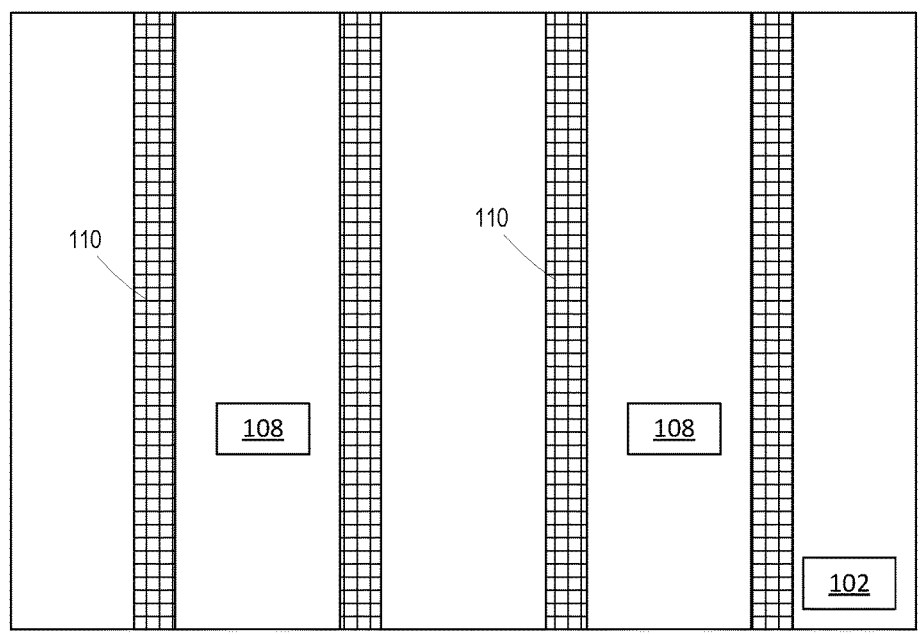
Figure 2M:
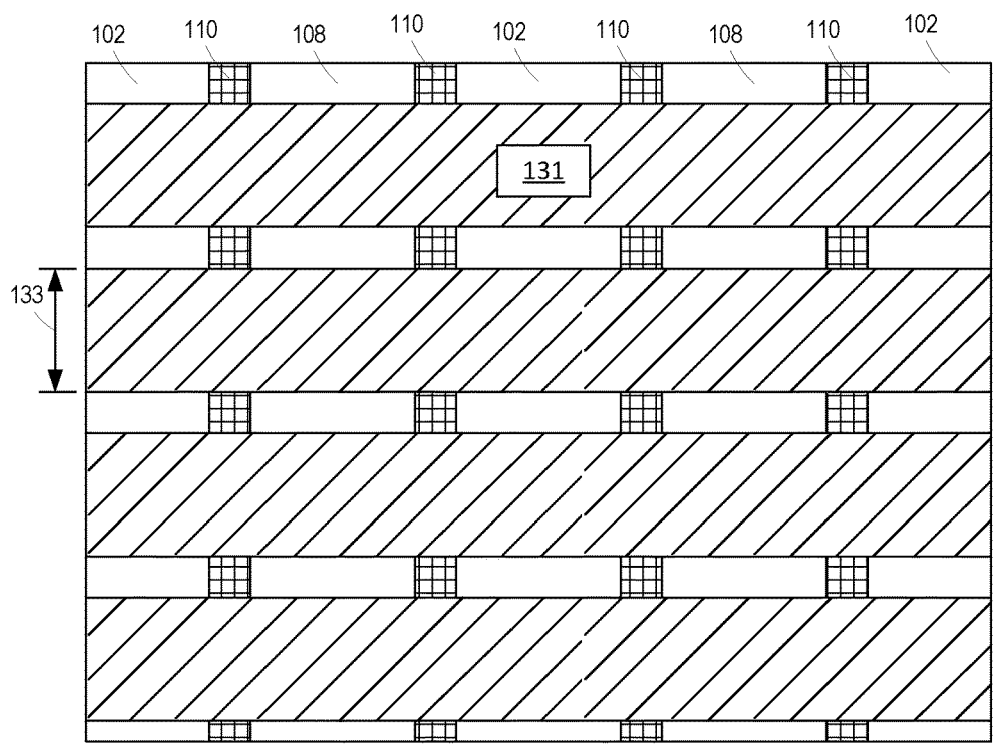
Figure 2N:
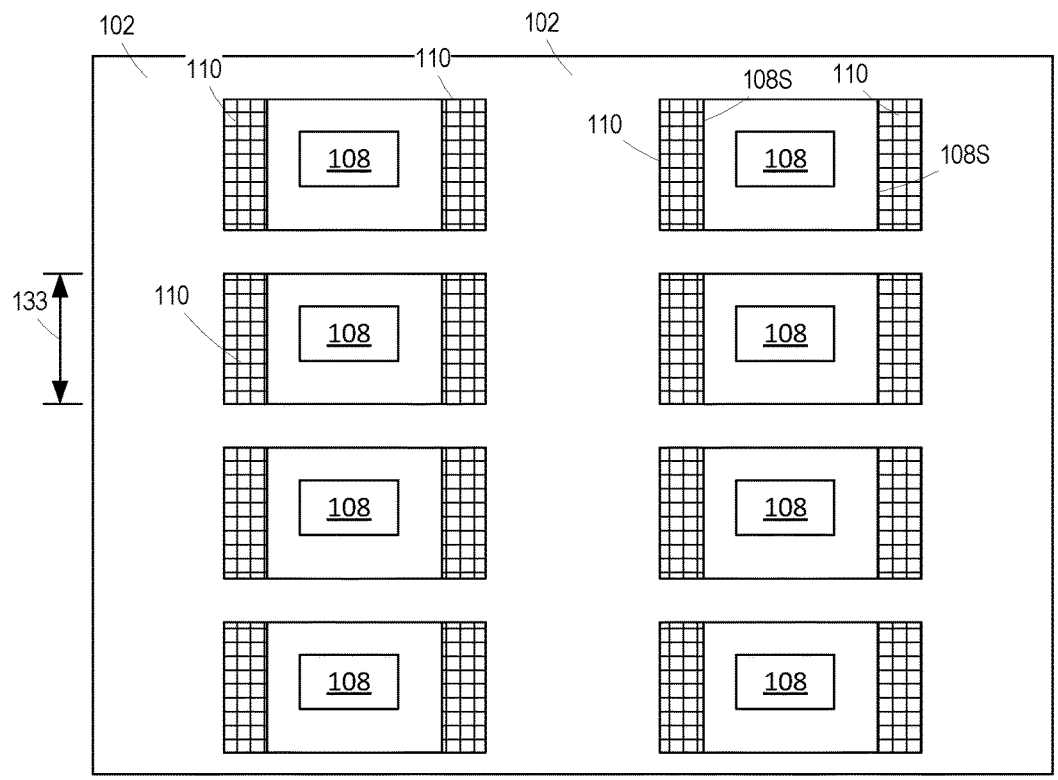

FIGS. 2A-2N depict an illustrative process flow wherein four illustrative vertically-oriented channel semiconductor structures 110 will be formed above a semiconductor substrate 102. The substrate 102 may have a variety of configurations, such as a bulk semiconductor (e.g., silicon) configuration. The substrate 102 may have a bulk configuration (as depicted in FIG. 2A) with an upper surface 102S or a semiconductor-on-insulator (SOI) or a silicon-on-insulator configuration (not shown) that includes a bulk semiconductor layer, a buried insulation layer (e.g., silicon dioxide), and an active layer (e.g., silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. In one illustrative example, the substrate 102 may be a (100) substrate with an orientation (xyz plane) of 45 degrees thereby insuring that the direction of the top of the vertically-oriented channel semiconductor structure 110 is in the 100 plane and the sidewall of the vertically-oriented channel semiconductor structure 110 is in the 100 plane. In another illustrative example, the substrate 102 may be a (110) substrate with an orientation (xyz plane) of zero degrees thereby insuring that the direction of the top of the vertically-oriented channel semiconductor structure 110 is in the 110 plane and the sidewall of the vertically-oriented channel semiconductor structure 110 is in the 100 plane.

FIG. 2B (cross-sectional side view) and FIG. 2C (plan view) depict the product after several processing operations have been performed. First, a patterned etch mask 104 was formed above the substrate 102 (the patterned etch mask is not shown in FIG. 2C for clarity purposes). The patterned etch mask 104 may be comprised of one or more layers of material and it may be formed by forming one or more layers of material and thereafter patterning those materials using known photolithography and etching techniques. In one illustrative embodiment, the patterned etch mask 104 may be comprised of a layer of silicon dioxide formed on and in contact with the surface 102S of the substrate 102 and a layer of silicon nitride (not separately shown) formed on the layer of silicon dioxide. Next, one or more etching processes were performed through a patterned etch mask 104 so as to define a plurality of trenches 106 in the substrate 102. This etching process results in the formation of a plurality of sacrificial mandrel structures 108 having a generally rectangular configuration when viewed from above. In the depicted example, the sacrificial mandrel structures 108 comprise opposing lateral sidewall surfaces 108S, opposing end sidewall surfaces 108E and an upper surface 108X. The lateral width 108W, the vertical height 108H and the pitch 109 between the mandrel structures 108 may vary depending upon the particular application. In one illustrative example, the width 108W may range from about 2-8 nm, the height 108H may range from about 5-100 nm and the pitch 109 may range from about 5-30 nm. In the illustrative examples depicted in the attached drawings, the trenches 106 and the sacrificial mandrel structures 108 and the vertically-oriented channel semiconductor structures 110 (discussed below) are all depicted as having a uniform size and shape. However, such uniformity in the size and shape of the sacrificial mandrel structures 108 and the vertically-oriented channel semiconductor structure 110 is not required to practice at least some aspects of the inventions disclosed herein. In the attached figures, the trenches 106 are depicted as having been formed by performing an anisotropic etching process that results in the sacrificial mandrel structures 108 having a simplistically depicted, generally rectangular configuration. In an actual real-world device, the sidewalls 108S, 108E of the sacrificial mandrel structures 108 may be somewhat outwardly tapered (i.e., the sacrificial mandrel structures 108 may be wider at the bottom of the sacrificial mandrel structures 108 than they are at the top of the sacrificial mandrel structures 108) although that configuration is not depicted in the attached drawings. Thus, the size and configuration of the trenches 106, the sacrificial mandrel structures 108 and the vertically-oriented channel semiconductor structures 110, and the manner in which they are made, should not be considered a limitation of the present invention. For ease of disclosure, the substantially rectangular trenches 106, sacrificial mandrel structures 108 and vertically-oriented channel semiconductor structures 110 will be depicted in the subsequent drawings.

FIG. 2D depicts the product after a conformal layer of alternative channel semiconductor material 110L was formed on the opposing lateral sidewall surfaces 108S, on the opposing end sidewall surfaces 108 and on the upper surface 108X of the sacrificial mandrel structures 108 as well as in the trenches 106. The alternative channel semiconductor material 110L may be comprised of a semiconductor material that is different from the semiconductor material of the substrate 102. For example, if the substrate 102 is made of silicon, the alternative channel semiconductor material 110L may be made of silicon germanium ($Si_{(1-x)}Ge_x$ where "x" ranges from 0.1-1), such as $Si_{0.75}Ge_{0.25}$ or $Si_{0.50}Ge_{0.5}$, substantially pure germanium, a III-V compound semiconductor material, etc. The alternative channel semiconductor material 110L may be formed by performing an epitaxial growth process, and it may have a thickness 110T that is less than the critical thickness of the alternative channel semiconductor material 110L. As a result, in one illustrative embodiment, the alternative channel semiconductor material 110L may be formed in a fully-strained, substantially defect-free condition. In one illustrative example, the thickness 110T of the alternative channel semiconductor material 110L may be about 5 nm or less. Additionally, since the growth of the alternative channel semiconductor material 110L along, for example, the opposing lateral sidewall surfaces 108S of the sacrificial mandrel structures 108 is primarily in the direction indicated by the arrow 113 (i.e., in a direction that is substantially normal to the opposing end sidewall surfaces 108E), the overall height of the alternative channel semiconductor material 110L along the opposing end sidewall surfaces 108E, as indicated by the dimension 115, can be much taller than the critical thickness of the material of the alternative channel semiconductor material 110L. This means that the final vertically-oriented channel semiconductor structure 110 for a vertical transistor device 100 may be formed with a significantly greater height than was possible using prior art processing techniques, and the vertically-oriented channel semiconductor structure 110 may be formed in a substantially defect-free condition.

FIG. 2E (cross-sectional side view) and FIG. 2F (plan view) depict the product after a directional, anisotropic etching process was performed on the conformal layer of alternative channel semiconductor material 110L. As best seen in FIG. 2F, this etching process generally results in the formation of a spacer structure 110S comprised of the alternative channel semiconductor material positioned around the perimeter of each of the sacrificial mandrel structures 108, e.g., on the opposing lateral sidewall surfaces 108S and on the opposing end sidewall surfaces 108E. With reference to FIG. 2F, at some point during the process flow, the portions 110A on the opposing end sidewall surfaces 108E of the sacrificial mandrel structures 108 will be removed, thereby leaving only the portions of the spacer structure 110S positioned on opposing lateral sidewall surfaces 108S of the sacrificial mandrel structures 108 in place.

In the illustrative process flow depicted herein, after the formation of the spacer structure 110S, a patterned "cut mask" is formed on the product so as to expose the portions 110A of the spacer 110S for removal, as depicted by the dashed-line edges 112 of such a cut mask.

FIG. 2G depicts the product after several process operations were performed. First, an etching process was performed through the cut mask to remove the exposed portions 110A of the spacer 110S to thereby result in the formation of the final vertically-oriented channel semiconductor structures 110 positioned adjacent the opposing lateral sidewall surfaces 108S of the sacrificial mandrel structures 108. Next, the cut mask was removed. Thereafter, a layer of insulating material 114 (e.g., silicon dioxide) was deposited so as to overfill the trenches 106. Then, a planarization process, such as a chemical mechanical polishing (CMP) process, was performed to planarize the upper surface of the layer of insulating material 114 and thereby expose the upper surface 108X of the sacrificial mandrel structures 108.

FIG. 2H depicts the product after a timed, mandrel-removal etching process was performed to selectively remove the sacrificial mandrel structures 108 relative to the vertically-oriented channel semiconductor structures 110 and the layer of insulating material 114. In one embodiment, the etching process is performed such that the surface 102X of the substrate 102 exposed by removal of the sacrificial mandrel structures 108 is at approximately the same level as the depth of the trenches 106.

FIG. 2I (cross-sectional side view) and FIG. 2J (plan view) depict the product after the layer of insulating material 114 was removed. As depicted, the process flow described above results in the formation of four relatively tall vertically-oriented channel semiconductor structures 110 comprised of an alternative semiconductor material (as defined above). Of course, the methods disclosed herein may be performed to form vertically-oriented channel semiconductor structures 110 of any desired vertical height. At the point of processing depicted in FIG. 2J, four vertical transistor devices each comprising one of the vertically-oriented channel semiconductor structures 110 may be completed using various process flows, at least one of which will be described further later in this application.

As will be recognized by those skilled in the art after having read the present disclosure, other process flows involving other forms of sacrificial mandrel structures 108 may be performed while still reaping the benefits of the technology disclosed herein. In the process flow discussed immediately above, the sacrificial mandrel structures 108 were initially formed as individual discreet structures having a generally rectangular configuration. In another process flow, the sacrificial mandrel structures 108 may be elongated structures that are initially formed across the entire substrate. FIG. 2K is a plan view depicting the formation of a plurality of line-type elongated sacrificial mandrel structures 108 across the entire substrate. FIG. 2L is a plan view depicting the product after the vertically-oriented channel semiconductor structures 110 were formed on the opposing lateral sidewall surfaces 108S (see FIG. 2K) of the elongated line-type sacrificial mandrel structures 108. Thus, in this illustrative process flow, the vertically-oriented channel semiconductor structures 110 are not formed around the entire perimeter of a previously formed, discreet sacrificial mandrel structure 108, as was the case in the process flow discussed above. Of course, in some cases, a portion of the vertically-oriented channel semiconductor structures 110 may be formed on the extreme end sidewall surfaces (not shown) of the elongated line-type sacrificial mandrel structures 108. FIG. 2M is a plan view depicting the product after a cut mask 131 was formed on the product. The cut mask exposes portions of the elongated line-type sacrificial mandrel structures 108 and the vertically-oriented channel semiconductor structures 110 that are to be removed while masking the portions of the vertically-oriented channel semiconductor structures 110 (with a dimension 133) that are to remain in place. FIG. 2N (plan view) depicts the product after one or more etching processes were performed through the cut mask 131 to remove the exposed portions of the elongated line-type sacrificial mandrel structures 108 and the exposed portions of the vertically-oriented channel semiconductor structures 110 and after the cut mask was removed. As depicted, this results in eight generally rectangular shaped discreet sacrificial mandrel structures 108 with vertically-oriented channel semiconductor structures 110 formed on the opposing lateral sidewall surfaces 108S of each of the discreet sacrificial mandrel structures 108. At this point, the processing operations described above in FIGS. 2G-2J may be performed to selectively remove the sacrificial mandrel structures 108 relative to the vertically-oriented channel semiconductor structures 110, thereby resulting in 16 separate vertically-oriented channel semiconductor structures 110. Thus, in one aspect of the subject matter disclosed herein, the alternative channel semiconductor material 110 is formed on at least the opposing lateral sidewall surfaces 108S of the sacrificial mandrel structures 108, i.e., it is not absolutely necessary that the alternative channel semiconductor material 110 be formed on the other surfaces of the sacrificial mandrel structures 108, although that may be done in some process flows. This aspect of the technology disclosed herein applies equally with respect to the additional embodiments discussed below.

Figure 3A:
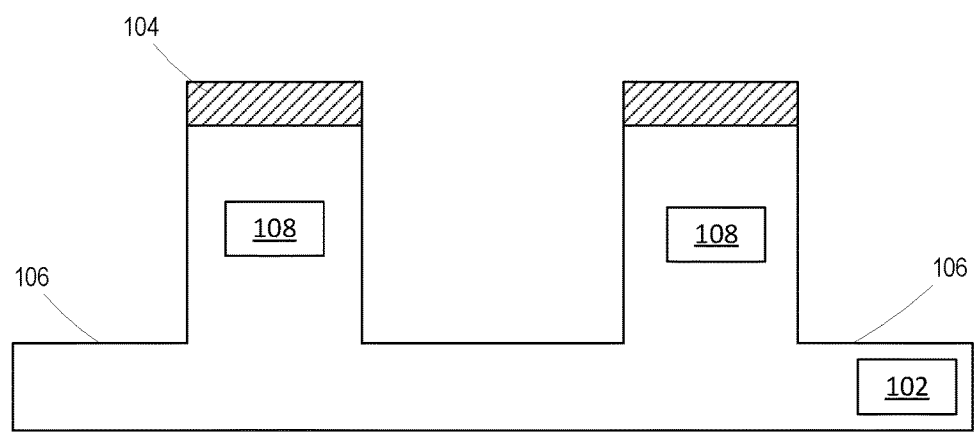
FIGS. 3A-3J depict other illustrative novel methods disclosed herein for forming a vertical transistor device with a channel structure comprised of alternative semiconductor materials.

FIGS. 3A-3J depict other illustrative novel methods disclosed herein for forming a vertical transistor device with a channel structure comprised of alternative semiconductor materials. FIG. 3A depicts the product at a point in fabrication that corresponds to that shown in FIGS. 2B and 2C, i.e., after formation of the discreet sacrificial mandrel structures 108.

Figure 3B:
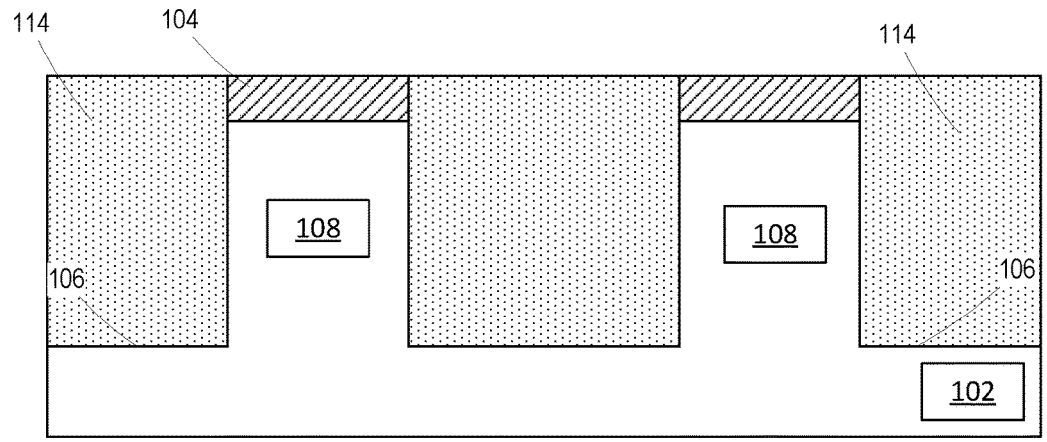

FIG. 3B depicts the product after the above-described layer of insulating material 114 was deposited so as to over-fill the trenches 106 and after a CMP process was performed that stopped on and exposes the patterned masking layer 104.

Figure 3C:
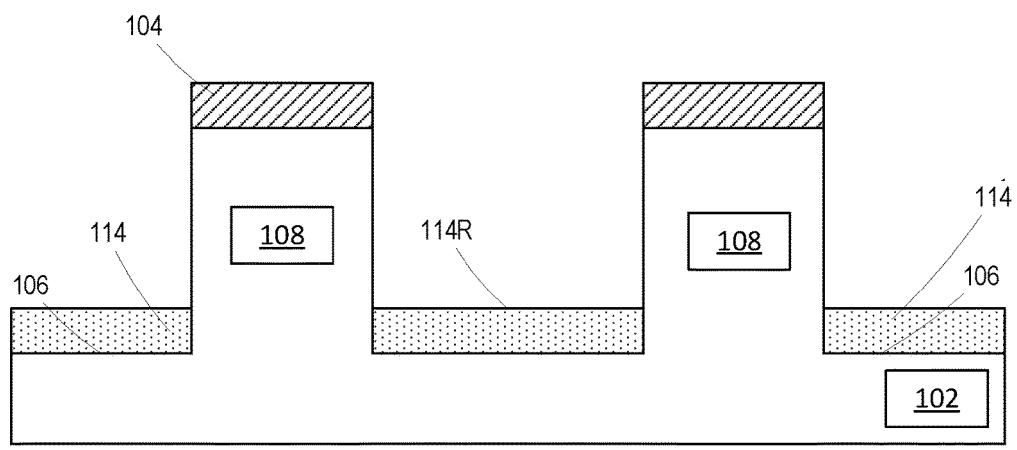

FIG. 3C depicts the product after a timed, recess etching process was performed on the layer of insulating material 114 such that it has a recessed upper surface 114R. The amount of recessing and the final thickness of the recessed layer of insulating material 114 may vary depending upon the particular application.

Figure 3D:
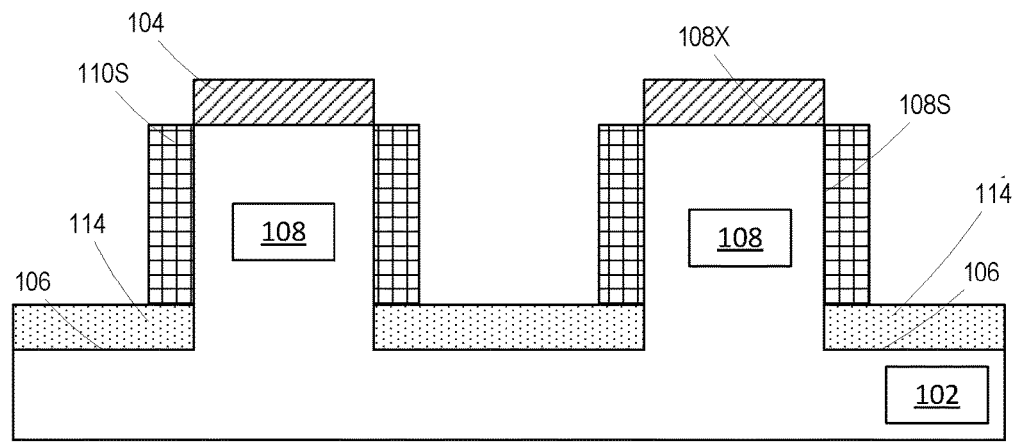
Figure 3E:
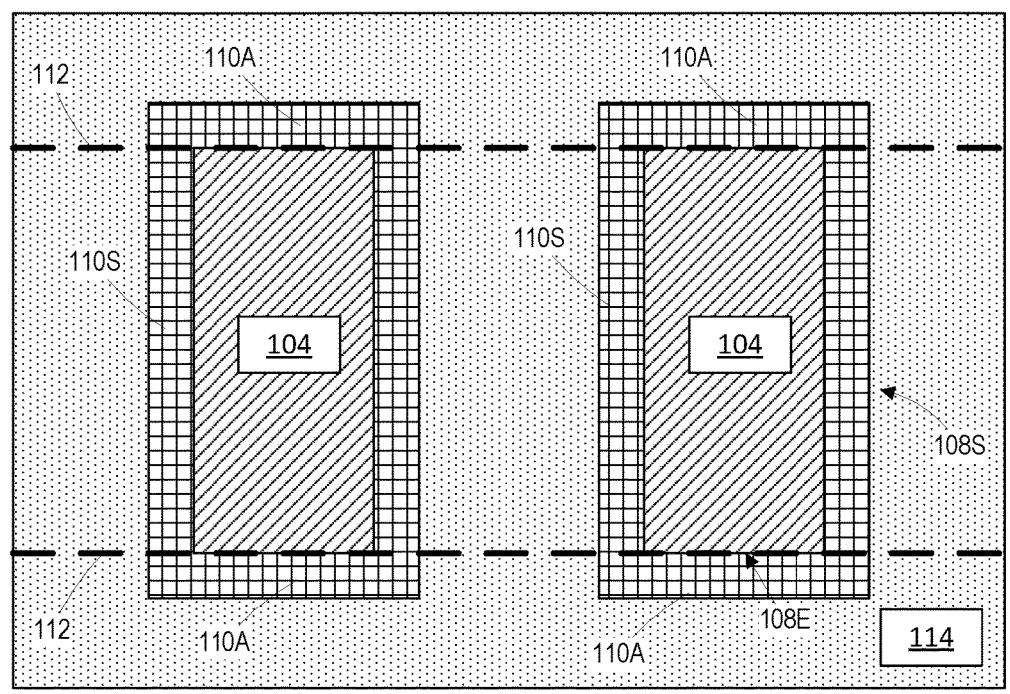

FIG. 3D (cross-sectional side view) and FIG. 3E (plan view) depict the product after the above-described alternative channel semiconductor material was selectively grown on only the opposing lateral sidewall surfaces 108S and the opposing end sidewall surfaces 108E of the sacrificial mandrel structures 108 around the entire perimeter of each of the discreet sacrificial mandrel structures 108. The alternative channel semiconductor material does not grow on the top surface 108X of the sacrificial mandrel structures 108 due to the presence of the patterned masking layer 104 and it does not grow in the bottom of the trenches 106 due to the presence of the recessed layer of insulating material 114. As best seen if FIG. 3E, this growth process results in the formation of the above-described spacer structure 110S comprised of the alternative channel semiconductor material positioned around the perimeter of each of the sacrificial mandrel structures 108. As noted above, and with reference to FIG. 3E, at some point during the process flow, the portions 110A of the alternative channel semiconductor material on the opposing end sidewall surfaces 108E of the sacrificial mandrel structures 108 will be removed, thereby leaving only the portions of the spacer structure 110S positioned on the opposing lateral sidewall surfaces 108S of the sacrificial mandrel structures 108 in place. In the illustrative process flow depicted herein, after the formation of the spacer structure 110S, the above-described patterned "cut mask" was formed on the product so as to expose the portions 110A of the spacer 110S for removal, as depicted by the dashed-line edges 112 of such a cut mask.

Figure 3F:
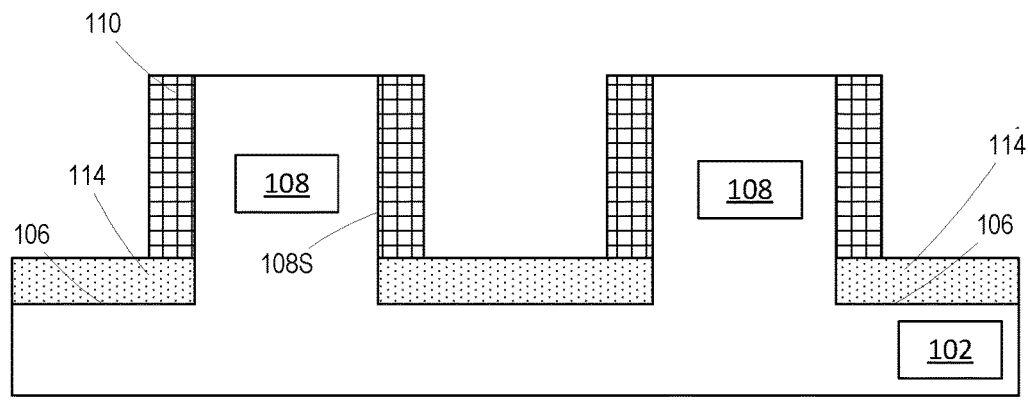

FIG. 3F depicts the product after several process operations were performed. First, an etching process was performed through the cut mask depicted in FIG. 3E to remove the exposed portions 110A of the spacer 110S to thereby result in the formation of the final vertically-oriented channel semiconductor structures 110 positioned adjacent the opposing lateral sidewall surfaces 108S of the sacrificial mandrel structures 108. Next, the cut mask was removed.

Figure 3G:
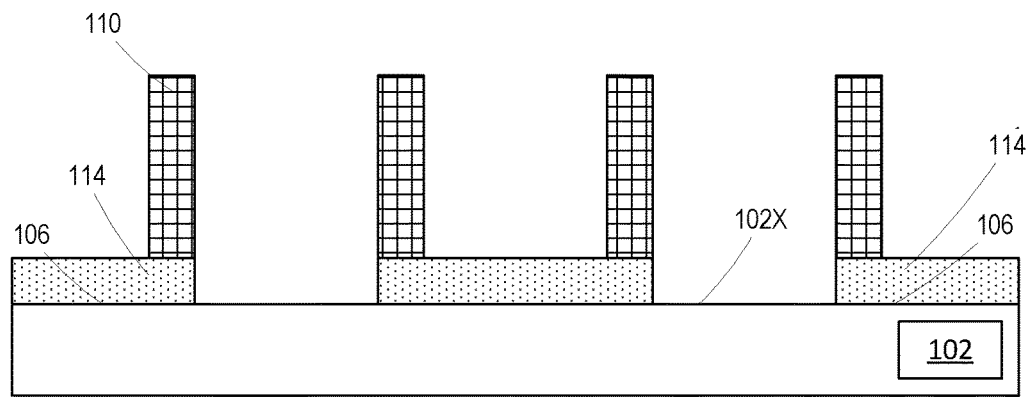

FIG. 3G depicts the product after the above-described timed, mandrel-removal etching process was performed to selectively remove the sacrificial mandrel structures 108 relative to the vertically-oriented channel semiconductor structures 110 and the layer of insulating material 114. In one embodiment, the etching process is performed such that the surface 102X of the substrate 102 exposed by removal of the sacrificial mandrel structures 108 is at approximately the same level as the depth of the trenches 106.

Figure 3H:
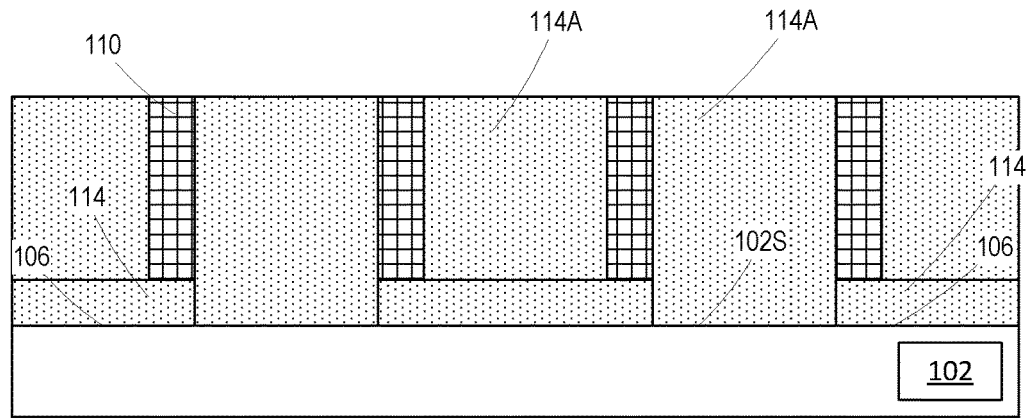

FIG. 3H depicts the product after another layer of insulating material 114A (e.g., silicon dioxide) was deposited so as to overfill the trenches 106. The layer of material 114A may or may not be comprised of the same material as that of the layer 114. Then, a planarization process, such as a chemical mechanical polishing (CMP) process, was performed to planarize the upper surface of the layer of insulating material 114A with the upper surfaces of the vertically-oriented channel semiconductor structures 110.

Figure 3I:
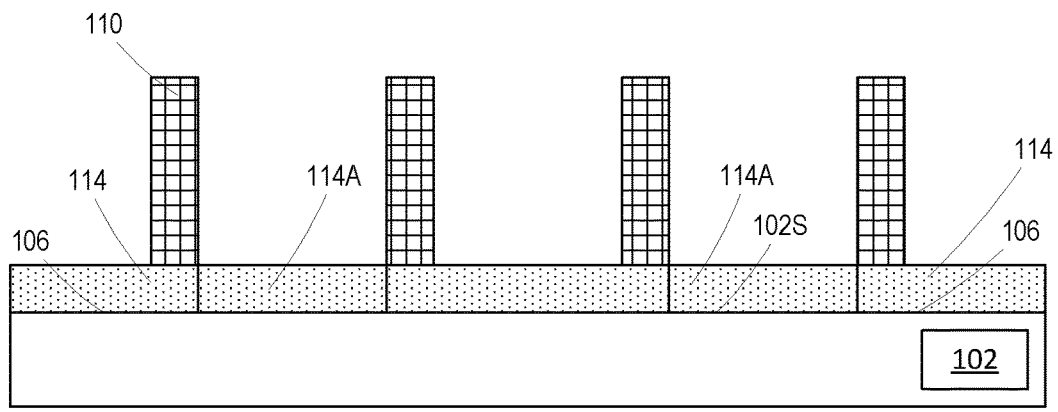
Figure 3J:
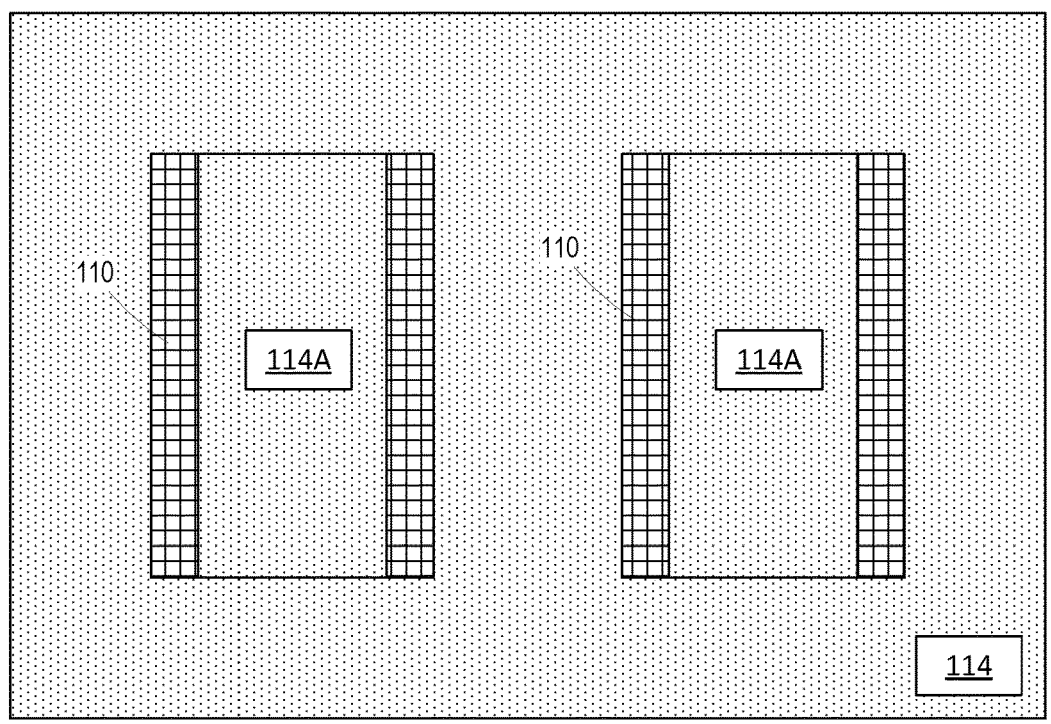

FIG. 3I (cross-sectional side view) and FIG. 3J (plan view) depict the product after a timed, recess etching process was performed to recess the layer of insulating material 114A and perhaps the layer of insulating material 114 to a desired thickness. As depicted, the process flow described above results in the formation of four relatively tall vertically-oriented channel semiconductor structures 110 comprised of an alternative semiconductor material (as defined above). Of course, as with the previous examples, the methods just disclosed may be performed to form vertically-oriented channel semiconductor structures 110 of any desired vertical height. Note that, in this illustrative process flow, the vertically-oriented channel semiconductor structures 110 are completely insulated from the substrate 102 due to the presence of the insulating material 114 between each of the vertically-oriented channel semiconductor structures 110 and the substrate 102. At the point of processing depicted in FIG. 3J, four vertical transistor devices each comprising one of the vertically-oriented channel semiconductor structures 110 may be completed using various process flows, at least one of which will be described further later in this application.

Figure 4A:
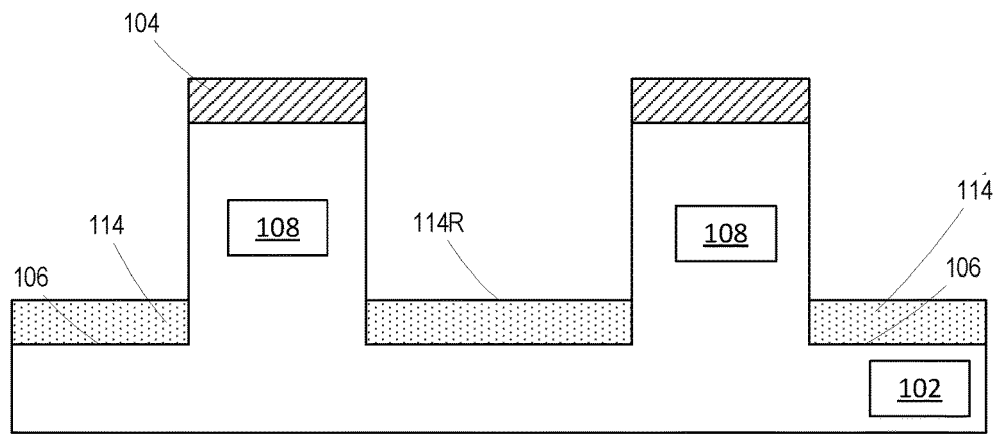
FIGS. 4A-4K depict still further illustrative novel methods disclosed herein for forming a vertical transistor device with a channel structure comprised of alternative semiconductor materials.

FIGS. 4A-4K depict still further illustrative novel methods disclosed herein for forming a vertical transistor device with a channel structure comprised of alternative semiconductor materials. FIG. 4A depicts the product at a point in fabrication that corresponds to that shown in FIG. 3C, i.e., after formation of the sacrificial mandrel structures 108 and the recessed layer of insulating material 114 in the trenches 106.

Figure 4B:
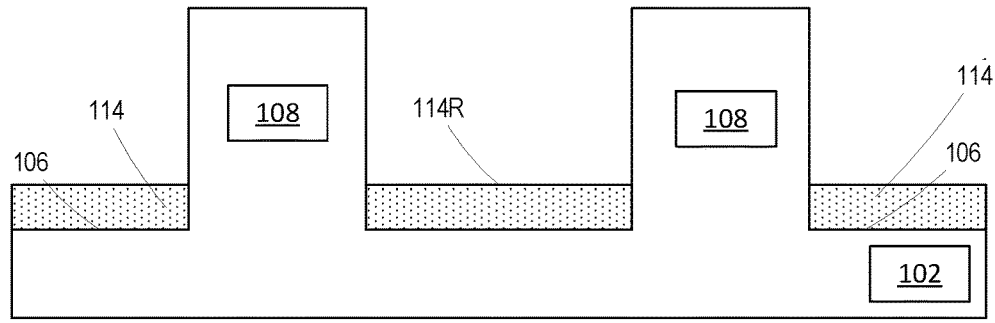

FIG. 4B depicts the product after an etching process was performed to selectively remove the patterned mask layer 104 selectively relative to the surrounding materials. This process exposes the side surfaces and the top surface of the sacrificial mandrel structures 108.

Figure 4C:
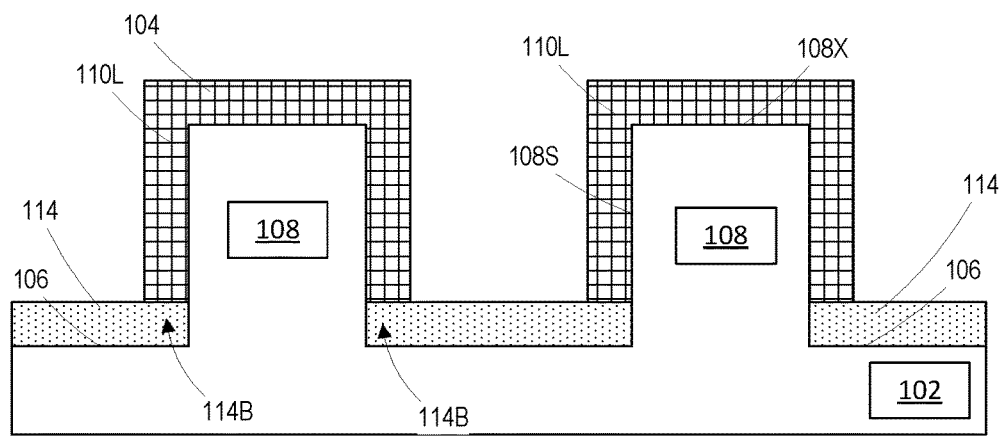

FIG. 4C depicts the product after a first epitaxial growth process was performed to selectively grow the above-described alternative channel semiconductor material 110L on the exposed opposing lateral sidewall surfaces 108S, on the opposing end sidewall surfaces 108E and on the top surface 108X of the illustrative discreet sacrificial mandrel structures 108 around the entire perimeter of each of the sacrificial mandrel structures 108. Note that the alternative channel semiconductor material does not grow in the bottom of the trenches 106 due to the presence of the recessed layer of insulating material 114 and that the alternative channel semiconductor material is positioned above a first portion 114B of the recessed layer of insulating material 114.

Figure 4D:
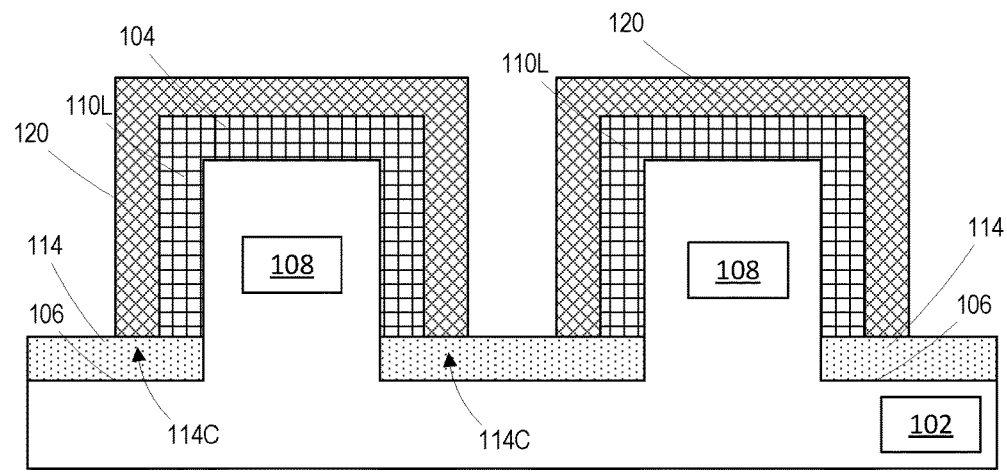

FIG. 4D depicts the product after a second epitaxial growth process was performed to selectively grow a layer of alternative semiconductor material 120 on the alternative semiconductor material 110L shown in FIG. 4C. The alternative semiconductor material 120 may be comprised of a semiconductor material that is different than that of the alternative semiconductor material 110L. For example, in the case where the material 110L is comprised of SiGe, the alternative semiconductor material 120 may be comprised of, for example, silicon or a III-V compound semiconductor material. The alternative semiconductor material 120 may be formed to any desired thickness. Note that the alternative channel semiconductor material 120 also does not grow in the bottom of the trenches 106 due to the presence of the recessed layer of insulating material 114 and that the alternative channel semiconductor material 120 is positioned above a second portion 114C of the recessed layer of insulating material 114.

Figure 4E:
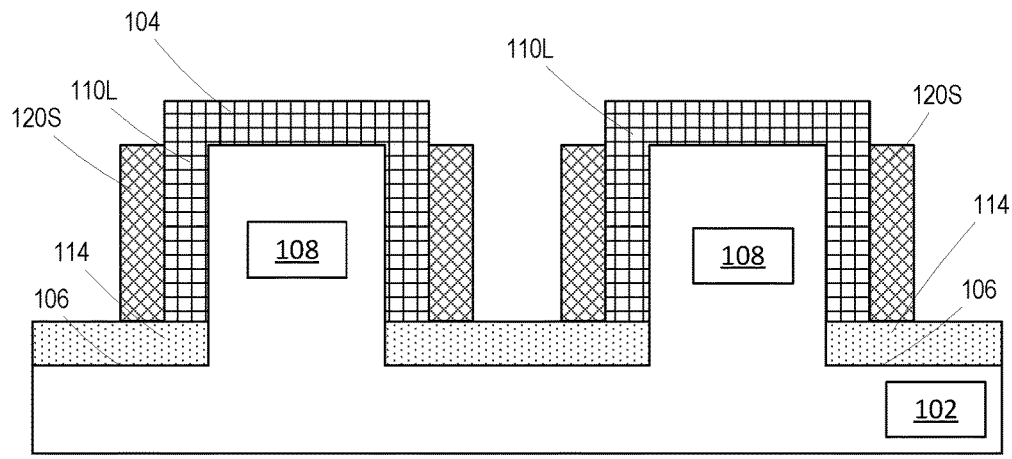

FIG. 4E depicts the product after a first directional, anisotropic etching process was performed on the alternative semiconductor material 120 to selectively remove horizontally oriented portions of the material 120 relative to surrounding materials, including the alternative semiconductor material 110L. This etching process generally results in the formation of a spacer structure 120S comprised of the alternative channel semiconductor material 120 positioned on the alternative semiconductor material 110L around the perimeter of each of the sacrificial mandrel structures 108.

Figure 4F:
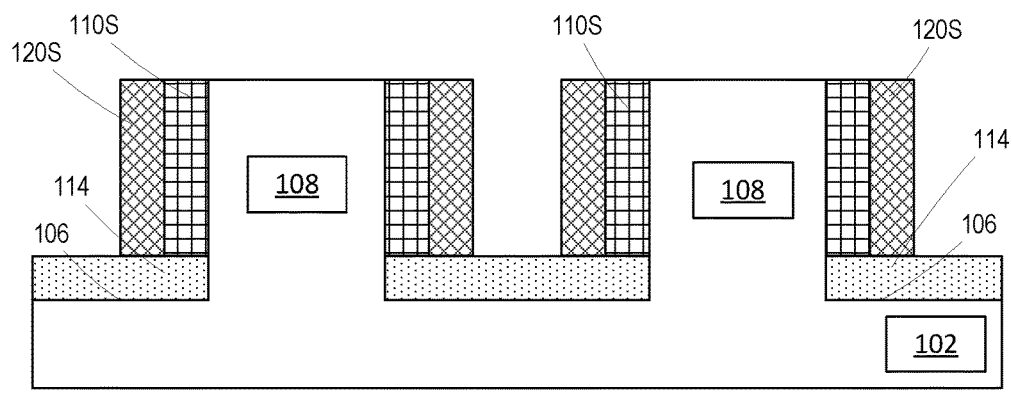

FIG. 4F depicts the product after a second directional, anisotropic etching process was performed on the alternative semiconductor material 110L to selectively remove horizontally oriented portions of the material 110L relative to surrounding materials, including the alternative semiconductor material 120. This second etching process generally results in the formation of the above-described spacer structure 110S comprised of the alternative channel semiconductor material 110L positioned on the opposing lateral sidewall surfaces 108S and the opposing end sidewall surfaces 108E of the sacrificial mandrel structures 108 around the perimeter of each of the sacrificial mandrel structures 108.

Figure 4G:
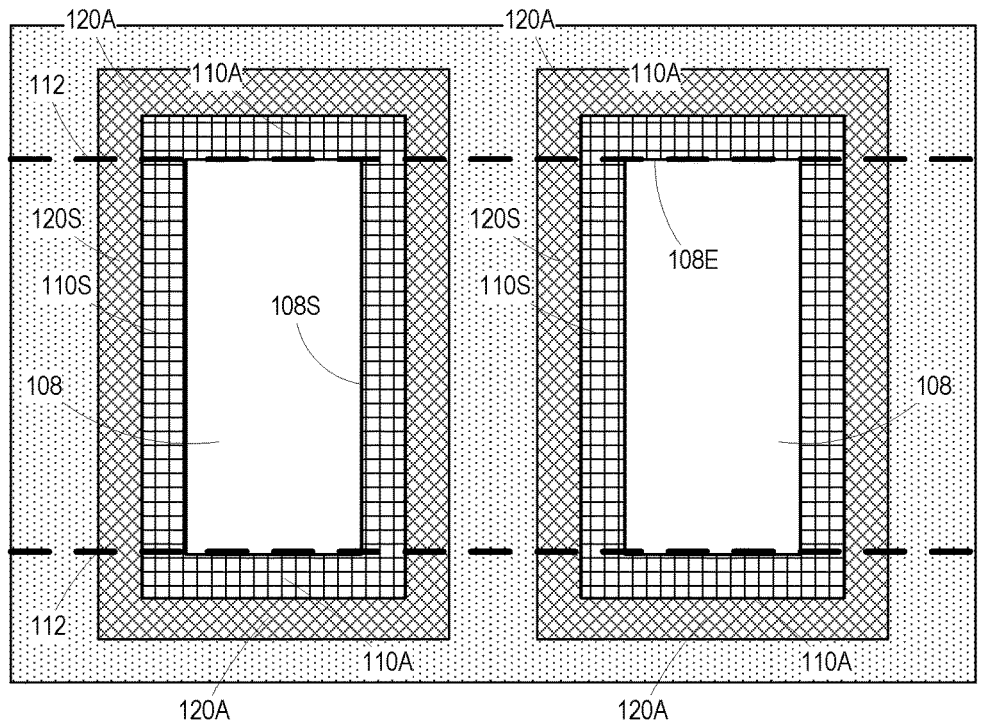

FIG. 4G is a plan view depicting the product at this point in this particular process flow. As with the other process flows noted above, at some point in this particular process flow, the portions 110A and 120A adjacent the opposing end sidewall surfaces 108E of the sacrificial mandrel structures 108 will be removed, thereby leaving only the portions of the spacer structures 110S and 120S positioned adjacent the opposing lateral sidewall surfaces 108S of the sacrificial mandrel structures 108 in place. In the illustrative process flow depicted herein, after the formation of the spacer structures 120S and 110S, the above-described patterned "cut mask" was formed on the product so as to expose the portions 110A of the spacer 110S and the portions 120A of the spacer 120 for removal, as depicted by the dashed-line edges 112 of such a cut mask. Thereafter, one or more etching processes were performed through the cut mask to remove the exposed portions 110A, 120A. These etching processes result in the formation of four pairs of vertically-oriented channel semiconductor structures 110 and four vertically-oriented channel semiconductor structures 120 that are in physical contact with one another.

Figure 4H:
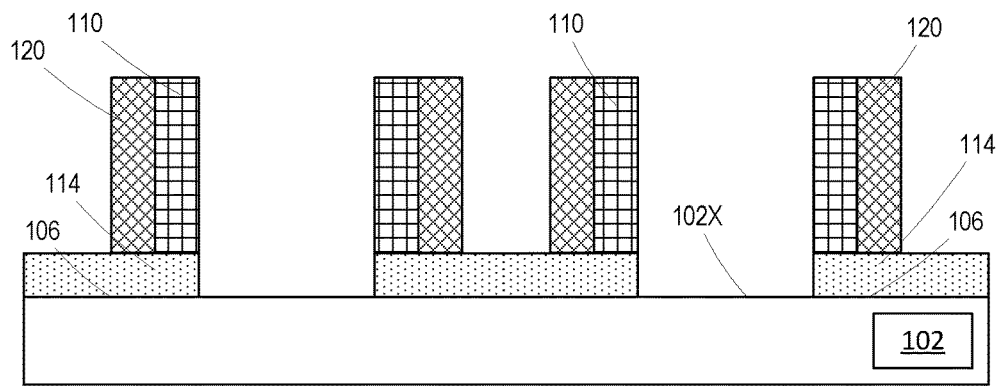

FIG. 4H depicts the product after the above-described timed, mandrel-removal etching process was performed to selectively remove the sacrificial mandrel structures 108 relative to the vertically-oriented channel semiconductor structures 110, 120. In one embodiment, the etching process is performed such that the surface 102X of the substrate 102 exposed by removal of the sacrificial mandrel structures 108 is at approximately the same level as the depth of the trenches 106.

Figure 4I:
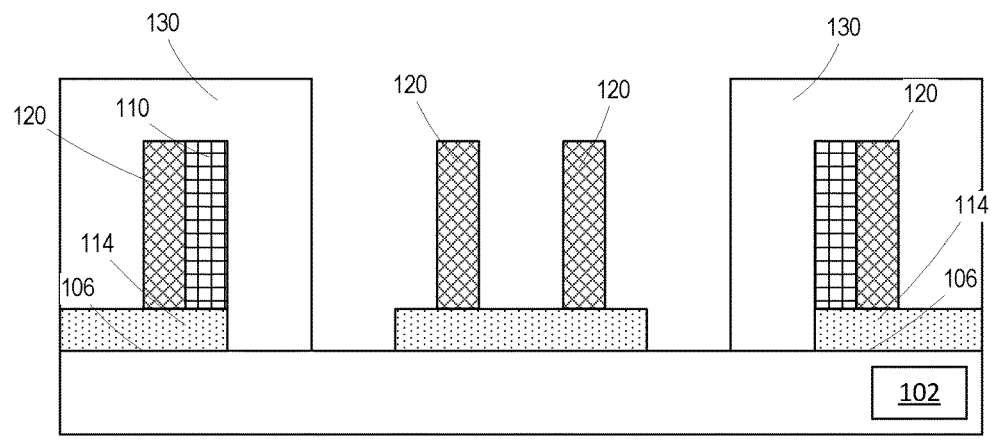

The methods disclosed herein allow for the selective removal of some of the vertically-oriented channel semiconductor structures 110, 120 relative to one another so as to enable the formation of vertical transistor devices of different types (e.g., N-type or P-type). In one illustrative example, the vertically-oriented channel semiconductor structures 110 may be adapted for use with P-type devices, while the vertically-oriented channel semiconductor structures 120 may be adapted for use with N-type devices (or vice-versa). Accordingly, FIG. 4I depicts the product after several process operations were performed. First, a patterned masking layer 130 was formed above the substrate so as to expose the inner two pairs of vertically oriented channel semiconductor structures, each of which is comprised of a vertically-oriented channel semiconductor structure 110 and a vertically-oriented channel semiconductor structure 120. In accordance with one illustrative process flow disclosed herein, an etching process was then performed though the patterned etch mask 130 to selectively remove the exposed vertically-oriented channel semiconductor structures 110 relative to the vertically-oriented channel semiconductor structures 120.

Figure 4J:
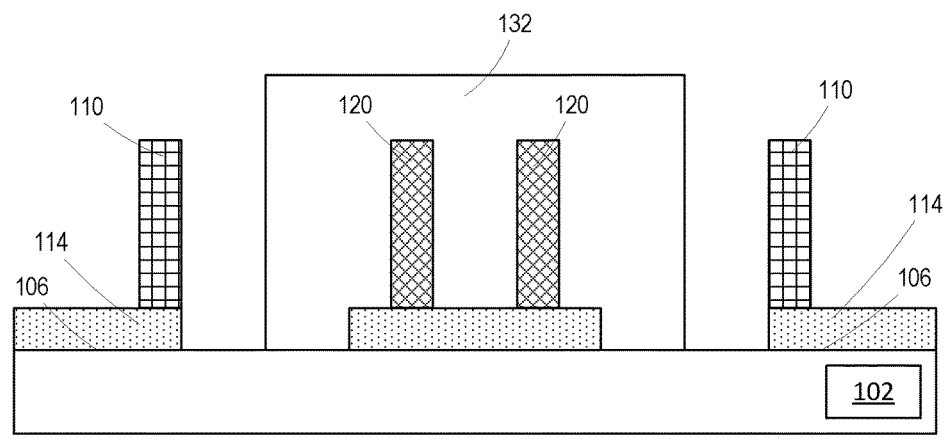

FIG. 4J depicts the product after several process operations were performed. First, the patterned masking layer 130 was removed. Thereafter, another patterned masking layer 132 was formed so as to cover the two inner vertically-oriented channel semiconductor structures 120, while leaving the outer two pairs of vertically oriented channel semiconductor structures, each of which is comprised of a vertically-oriented channel semiconductor structure 110 and a vertically-oriented channel semiconductor structure 120, exposed. In accordance with one illustrative process flow disclosed herein, another etching process was then performed though the patterned etch mask 132 to selectively remove the exposed vertically-oriented channel semiconductor structures 120 while leaving the vertically-oriented channel semiconductor structures 110 in place.

Figure 4K:
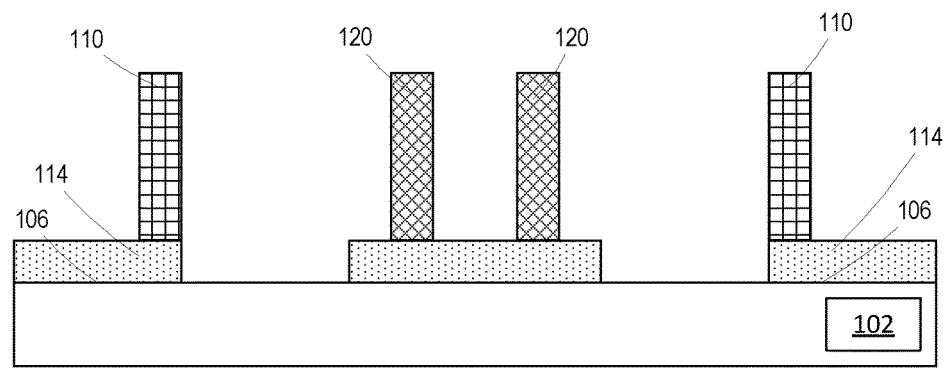

FIG. 4K depicts the product after the patterned etch mask 132 was removed. As depicted, this illustrative process flow results in the formation of two of the vertically-oriented channel semiconductor structures 110 and two of the vertically-oriented channel semiconductor structures 120. At this point in the process flow, an additional layer of insulating material (not shown) may be formed above the substrate 102 so as to cover the portions of the substrate 102 exposed by the removal of the sacrificial mandrel structures 108. Thereafter, four vertical transistor devices may be formed using structures 110/120. Each of two of the four vertical transistor devices comprises one of the vertically-oriented channel semiconductor structures 110 while each of the other two of the four vertical transistor devices comprises a vertically oriented channel semiconductor structure 120.

Figure 5A:
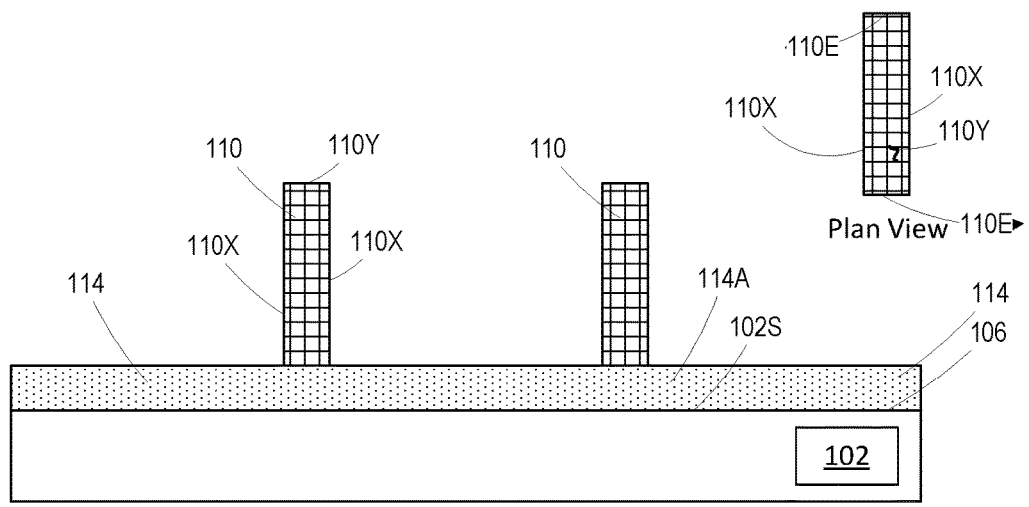
FIGS. 5A-5C depict one illustrative example of two vertical transistor devices that each comprise a vertically-oriented channel semiconductor structure comprised of an alternative semiconductor material that was formed in accordance with one of the illustrative process flows described herein.
Figure 5B:
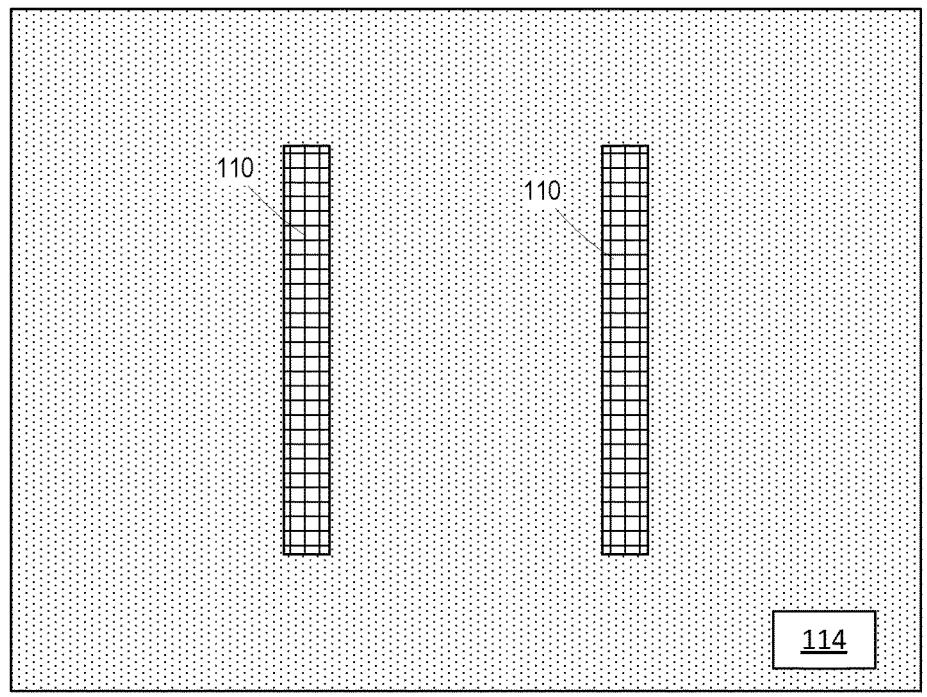
Figure 5C:
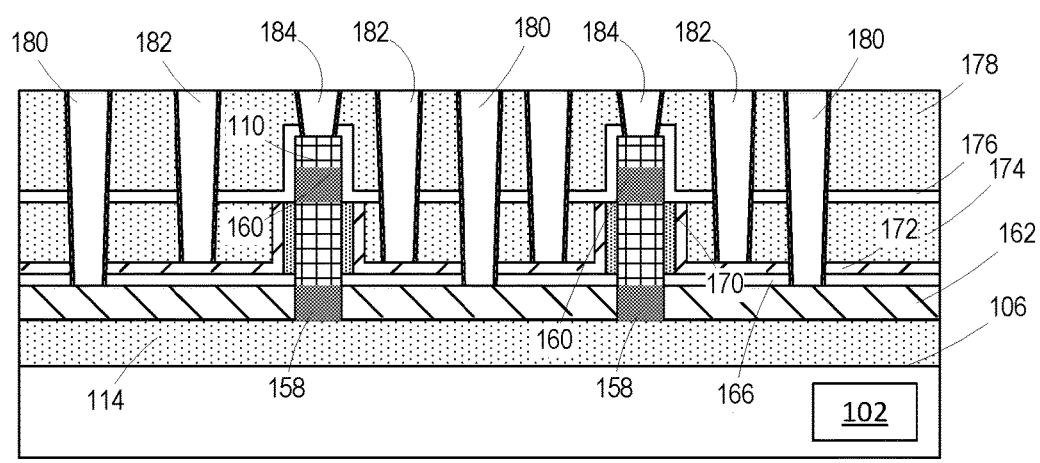

FIGS. 5A-5C depict one illustrative example of two vertical transistor devices that each comprises one of the vertically-oriented channel semiconductor structures 110 comprised of an alternative semiconductor material that was formed in accordance with one of the previously described process flows. In one example, FIG. 5A (cross-sectional side view) and FIG. 5B (plan view) depict the product wherein two illustrative vertically-oriented channel semiconductor structures 110 have been formed. Additionally, as shown in FIG. 5A, the vertically-oriented channel semiconductor structures 110, much like the sacrificial mandrel structures 108 depicted above, have opposing lateral sidewall surfaces 110X, a top surface 110Y and opposing end surfaces 110E (shown in the simplistic offset plan view of the vertically-oriented channel semiconductor structures 110 in FIG. 5A).

FIGS. 5A-5B depict the product at a point in fabrication that corresponds to that shown in FIG. 3I, i.e., after the formation of the vertically-oriented channel semiconductor structures 110 comprised of an alternative semiconductor material above the insulating material 114.

FIG. 5C depicts the product after the vertically-oriented transistor devices have been substantially completed by performing various processing steps that include, but are not limited to:

1. Formation of a bottom S/D conductive layer 162 that is conductively coupled to a lower S/D region 158. In some cases, if desired, the above-described alternative semiconductor material 120 (not shown) may be epitaxially grown on the exposed portions of the vertically-oriented channel semiconductor structure 110 above the bottom S/D conductive layer 162;
2. Formation of a bottom spacer 166 above the bottom S/D conductive layer 162;
3. Formation of a gate insulation layer 170, e.g., a high-k insulating material (k value of 10 or more), hafnium oxide, etc., on the vertically-oriented channel semiconductor structures 110 and above the bottom spacer 166. The gate insulation layer 170 may be initially deposited as a conformal layer of material. Thereafter, a directional, anisotropic etching process was performed on the gate insulation layer 170 to remove horizontally oriented portions of the gate insulation layer 170 while leaving the remaining portions of the gate insulation layer 170 positioned around the vertically-oriented channel semiconductor structures 110;
4. Formation of a gate conductive material layer 172 on the gate insulation layer 170. In one example, this may be accomplished by conformally depositing a layer of the gate conductive material and over-filling the trenches 106 with a layer of insulating material 174 (e.g., silicon dioxide). Then, one or more timed recess etching processes were performed to recess the layer of insulating material 174 and the gate conductive material layer 172 to a desired residual thickness (which may vary depending upon the application);
5. Thereafter, a conformal deposition process was performed to form an upper spacer 176 above the recessed layer of insulating material 174 and the recessed gate insulation layer 172;
6. Next, a layer of insulating material 178 (e.g., silicon dioxide) was deposited so as to overfill the trenches 106 above the upper spacer 176; and
7. Formation of a plurality of bottom S/D contact structures 180 (to contact the lower doped source/drain (S/D) region 158 via the bottom S/D conductive layer 162), a plurality of gate contact structures 182 (to contact the conductive materials of the gate structure) and a plurality of top S/D contact structures 184 (to contact the upper source/drain (S/D) region 160)

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
forming a sacrificial mandrel structure above a semiconductor substrate, said sacrificial mandrel structure comprising at least opposing lateral sidewall surfaces, said semiconductor substrate comprising a first semiconductor material, wherein said sacrificial mandrel structure further comprises a top surface that is covered by a masking layer;
forming a recessed layer of insulating material in at least one trench defined in said semiconductor substrate adjacent said sacrificial mandrel structure;
performing an epitaxial growth process to form a first conformal layer of second semiconductor material on at least said opposing lateral sidewall surfaces of said sacrificial mandrel structure but not on said covered top surface of said sacrificial mandrel structure, wherein said second semiconductor material positioned on said opposing lateral sidewall surfaces is positioned above a first portion of said recessed layer of insulating material;
removing said masking layer so as to expose said top surface of said sacrificial mandrel structure;
with said masking layer removed, selectively removing said sacrificial mandrel structure relative to said vertically-oriented channel semiconductor structures by performing a mandrel-removal etching process, thereby leaving said vertically-oriented channel semiconductor structures in position above said first portion of said recessed layer of insulating material; and
forming upper and lower source/drain regions in each of said vertically-oriented channel semiconductor struc- tures and a gate structure around each of said vertically-oriented channel semiconductor structures.

2. The method of claim 1, wherein forming said sacrificial mandrel structure comprises:
  forming a patterned masking layer above said semiconductor substrate; and
  performing an etching process through said patterned masking layer to define a generally rectangular shaped sacrificial mandrel structure that further comprises a plurality of opposed end sidewall surfaces and a top surface.

3. The method of claim 1, further comprising forming another recessed layer of insulating material on said semiconductor substrate between said vertically-oriented channel semiconductor structures in a space created by said removal of said sacrificial mandrel structure.

4. A method, comprising:
  forming a sacrificial mandrel structure above a semiconductor substrate, said sacrificial mandrel structure comprising at least opposing lateral sidewall surfaces and a top surface, said semiconductor substrate comprising a first semiconductor material;
  performing a first epitaxial growth process to form a first conformal layer of a second semiconductor material that is different from said first semiconductor material on at least said opposing lateral sidewall surfaces and said top surface of said sacrificial mandrel structure;
  after performing said first epitaxial growth process, performing an anisotropic etching process on said first conformal layer of said second semiconductor material to remove horizontally-oriented portions of said layer of said second semiconductor material from above at least said top surface of said sacrificial mandrel structure so as to thereby define a first plurality of vertically-oriented channel semiconductor structures comprised of said second semiconductor material positioned on said at least said opposing lateral sidewall surfaces of said sacrificial mandrel structure;
  selectively removing said sacrificial mandrel structure relative to said first plurality of vertically-oriented channel semiconductor structures; and
  forming upper and lower source/drain regions in each of said first vertically-oriented channel semiconductor structures and a gate structure around each of said first vertically-oriented channel semiconductor structures.

5. The method of claim 4, wherein said sacrificial mandrel structure further comprises a plurality of opposing end sidewall surfaces and wherein performing said epitaxial growth process further comprises performing said epitaxial growth process to form said first conformal layer of said second semiconductor material on said opposing end sidewall surfaces.

6. The method of claim 5, further comprising:
  forming a patterned masking layer above said semiconductor substrate that exposes portions of said first conformal layer of said second semiconductor material positioned on said opposing end sidewall surfaces of said sacrificial mandrel structure; and
  performing an etching process through said patterned masking layer to remove said exposed portions of said first conformal layer of said second semiconductor material on said opposing end sidewall surfaces while leaving remaining portions of said first conformal layer of said second semiconductor material in position on said opposing lateral sidewall surfaces of said sacrificial mandrel structure.

7. The method of claim 4, wherein said sacrificial mandrel structure further comprises a plurality of opposing end sidewall surfaces and wherein performing said epitaxial growth process to form said first conformal layer of said second semiconductor material on said at least said opposing lateral sidewall surfaces and said top surface of said sacrificial mandrel structure further comprises forming said first conformal layer of said second semiconductor material on said opposing end sidewall surfaces of said sacrificial mandrel structure prior to performing said anisotropic etching process on said first conformal layer of said second semiconductor material.

8. The method of claim 4, further comprising:
  forming a layer of insulating material in at least one trench located in said semiconductor substrate adjacent said vertically-oriented channel semiconductor structures;
  with said layer of insulating material in position, selectively removing said sacrificial mandrel structure relative to said vertically-oriented channel semiconductor structures by performing a mandrel-removal etching process; and
  after performing said mandrel-removal etching process, removing said layer of insulating material.

9. The method of claim 1, wherein said sacrificial mandrel structure further comprises a plurality of opposing end sidewall surfaces and wherein performing said epitaxial growth process further comprises performing said epitaxial growth process to form said layer of said second semiconductor material on said opposing end sidewall surfaces.

10. The method of claim 9, further comprising:
  forming a patterned masking layer above said semiconductor substrate that exposes portions of said layer of said second semiconductor material positioned on said opposing end sidewall surfaces of said sacrificial mandrel structure; and
  performing an etching process through said patterned masking layer to remove said exposed portions of said layer of said second semiconductor material on said opposing end sidewall surfaces while leaving remaining portions of said layer of said second semiconductor material in position on said opposing end sidewall surfaces of said sacrificial mandrel structure.

11. The method of claim 4, further comprising:
  forming a recessed layer of insulating material in at least one trench defined in said substrate adjacent said sacrificial mandrel structure prior to performing said first epitaxial growth process;
  performing a second epitaxial growth process to form a second conformal layer of a third semiconductor material that is different from said second semiconductor material on said first conformal layer and above a second portion of said recessed layer of insulating material;
  wherein performing said anisotropic etching process comprises performing a first phase of said anisotropic etching process on said second conformal layer to remove at least horizontally-oriented portions of said second conformal layer from above said first conformal layer so as to thereby define a plurality of second vertically-oriented channel semiconductor structures comprised of said third semiconductor material positioned adjacent said first conformal layer and above said second portion of said recessed layer of insulating material;
  after performing said first phase, performing a second phase of said anisotropic etching process on said first conformal layer to remove said at least horizontally-oriented portions of said first conformal layer from above said top surface of said sacrificial mandrel structure; and selectively removing said sacrificial mandrel structure relative to said first and second vertically-oriented channel semiconductor structures by performing a mandrel-removal etching process.

12. The method of claim 11, further comprising:

forming a patterned etch mask that exposes at least one first vertically-oriented channel semiconductor structure and at least one second vertically-oriented channel semiconductor structure that is in physical contact with said at least one vertically-oriented channel semiconductor structure; and performing a selective etching process through said patterned etch mask to selectively remove one of said first or said second vertically-oriented channel semiconductor structures while leaving in place a remaining one of the other of said first or said second vertically-oriented channel semiconductor structure.

13. The method of claim 12, wherein said sacrificial mandrel structure further comprises a plurality of opposing end sidewall surfaces and wherein performing said first epitaxial growth process further comprises performing said first epitaxial growth process so as to form said first conformal layer on said opposing end sidewall surfaces of said sacrificial mandrel structure.

14. The method of claim 13, further comprising:

forming a patterned masking layer above said semiconductor substrate that exposes portions of said second conformal layer that are positioned on said portions of said first conformal layer that are positioned on said opposing end sidewall surfaces of said sacrificial mandrel structure; and performing at least one etching process through said patterned masking layer to remove said exposed portions of said second conformal layer and to remove said portions of said first conformal layer positioned on said opposing end sidewall surfaces of said sacrificial mandrel structure.

15. The method of claim 14, further comprising:

forming a lower doped monolayer that extends around an entire perimeter of each of said vertically-oriented channel semiconductor structures and contacts a first portion of each of said vertically-oriented channel semiconductor structures, said lower doped monolayer being doped with one of a P-type dopant or an N-type dopant;

forming an upper doped monolayer that extends around an entire perimeter of each of said vertically-oriented channel semiconductor structures and contacts a second portion of each of said vertically-oriented channel semiconductor structures, said upper doped monolayer being doped with a same type of dopant as is present in said lower doped monolayer;

performing an anneal process so as to cause:

dopant atoms in said lower doped monolayer to migrate into said first portion of each of said vertically-oriented channel semiconductor structures so as to thereby form a first doped region in each of said vertically-oriented channel semiconductor structures; and dopant atoms in said upper doped monolayer to migrate into said second portion of each of said vertically-oriented channel semiconductor structures so as to thereby form a second doped region in each of said vertically-oriented channel semiconductor structures;

after performing said anneal process, removing said upper and lower doped monolayers; and forming a gate structure around each of said vertically-oriented channel semiconductor structures.

16. The method of claim 15, further comprising forming upper and lower source/drain regions in said remaining one of said other of said first or second vertically-oriented channel semiconductor structure and a gate structure around said remaining one of said other of said first or second vertically-oriented channel semiconductor structure.

* * * * *